United States Patent
Ito

(10) Patent No.: US 11,937,763 B2
(45) Date of Patent: Mar. 26, 2024

(54) CLEANING NOZZLE AND CLEANING METHOD

(71) Applicant: DISCO CORPORATION, Tokyo (JP)

(72) Inventor: Fumiaki Ito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 164 days.

(21) Appl. No.: 17/217,262

(22) Filed: Mar. 30, 2021

(65) Prior Publication Data

US 2021/0307577 A1    Oct. 7, 2021

(30) Foreign Application Priority Data

Apr. 3, 2020    (JP) ................................ 2020-067455

(51) Int. Cl.
*H01L 21/67*    (2006.01)
*A47L 5/14*    (2006.01)
*A47L 9/08*    (2006.01)

(52) U.S. Cl.
CPC ..................... *A47L 9/08* (2013.01); *A47L 5/14* (2013.01); *H01L 21/67034* (2013.01)

(58) Field of Classification Search
CPC .................................... B08B 5/02; B08B 5/04
See application file for complete search history.

(56) References Cited

U.S. PATENT DOCUMENTS

| | | | |
|---|---|---|---|
| 2008/0163899 A1* | 7/2008 | Takiguchi | B08B 3/02 134/30 |
| 2012/0079672 A1* | 4/2012 | Cho | H01L 21/67028 15/345 |
| 2016/0056062 A1* | 2/2016 | Lee | H01L 21/26 438/798 |
| 2019/0105691 A1 | 4/2019 | Hirakawa et al. | |

FOREIGN PATENT DOCUMENTS

| | | | |
|---|---|---|---|
| JP | 2008055398 A | 3/2008 | |
| JP | 2012049359 A | 3/2012 | |
| JP | 2013107041 A | 6/2013 | |
| JP | 2016039286 A | 3/2016 | |
| JP | 2016198874 A | 12/2016 | |
| KR | 2008000084 A | * 1/2008 | ............... B08B 3/02 |

OTHER PUBLICATIONS

Machine translation: KR 2008000084; Lee (Year: 2008).*
Search report issued in counterpart Singapore patent application No. 10202103309T, dated Apr. 1, 2022.

* cited by examiner

*Primary Examiner* — Natasha N Campbell
(74) *Attorney, Agent, or Firm* — GREER BURNS & CRAIN LTD.

(57) ABSTRACT

There is provided a cleaning nozzle that cleans a cleaning target face that is one of a holding face that holds a workpiece and/or a surface of the workpiece held on the holding face. The cleaning nozzle includes an air nozzle having an jet port for jetting air toward the cleaning target face and extending in a direction parallel to the cleaning target face, and a suction nozzle having a suction port for sucking air on the cleaning target face and arranged adjacent to and in parallel to the air nozzle.

13 Claims, 5 Drawing Sheets

CLEANING NOZZLE AND CLEANING METHOD

BACKGROUND OF THE INVENTION

Field of the Invention

The present invention relates to a cleaning nozzle and a cleaning method.

Description of the Related Art

According to the technologies disclosed in Japanese Patent Laid-Open No. 2012-049359, Japanese Patent Laid-Open No. 2016-039286, and Japanese Patent Laid-Open No. 2016-198874, air is jetted to a holding face that holds a wafer thereon to clean the holding face by dry cleaning.

For example, in a tape mounter in which a tape is pasted to one of faces of a wafer, the wafer is held at the other face thereof by the holding face. In this tape mounter, if dust adheres to the holding face, when a tape is pasted to one face (upper face) of the wafer held by the holding face, a portion that lifts from the holding face appears with the wafer due to the dust on the holding face. Therefore, at this portion, the tape is pushed stronger, and the paste layer of the tape is crushed. As a result, the thickness of the tape adhered to the wafer does not become uniform. Then, in a later processing step, it becomes difficult to process the wafer to a predetermined depth.

Therefore, in an existing tape mounter, the holding face for holding the other face of the wafer is cleaned by dry cleaning by jetting air to the holding face.

SUMMARY OF THE INVENTION

However, if dust on the holding face is blown off by air as described above, then the dust occasionally attaches to the holding face again.

Therefore, it is an object of the present invention to suppress, when a cleaning target face such as a holding face is cleaned by dry cleaning, blown off dust from reattaching to the cleaning target face.

In accordance with an aspect of the present invention, there is provided a cleaning nozzle that cleans a cleaning target face that is one of a holding face that holds a workpiece and/or a surface of the workpiece held on the holding face, the cleaning nozzle including an air nozzle having an jet port for jetting air toward the cleaning target face and extending in a direction parallel to the cleaning target face, and a suction nozzle having a suction port for sucking air on the cleaning target face and arranged adjacent to and in parallel to the air nozzle.

Preferably, the air nozzle is configured such that it jets ionized air from the jet port.

In accordance with another aspect of the present invention, there is provided a cleaning method for cleaning a cleaning target face that is one of a holding face for holding a workpiece and/or a surface of the workpiece held on the holding face, by using a cleaning nozzle. The cleaning nozzle includes an air nozzle having an jet port for jetting air toward the cleaning target face and extending in a direction parallel to the cleaning target face, and a suction nozzle having a suction port for sucking air existing on the cleaning target face and arranged adjacent to and in parallel to the air nozzle. The cleaning method includes a placement step of placing the cleaning nozzle above the cleaning target face in parallel to the cleaning target face with a gap left therebetween, and a cleaning step of jetting, while relatively moving the cleaning nozzle placed by the placement step and the cleaning target face in a direction parallel to the cleaning target face and besides crossing with an extension direction of the cleaning nozzle, air from the jet port and sucking the air reflected by the cleaning target face through the suction port to clean the cleaning target face.

Preferably, the air nozzle jets ionized air from the jet port. Further, preferably in the cleaning step, the suction port of the suction nozzle is arranged on an upstream side with respect to the jet port of the air nozzle in a direction of the movement of the cleaning target face with respect to the cleaning nozzle.

In the cleaning nozzle in accordance with the aspect and the cleaning method according to the another aspect of the present invention, air is jetted from the jet port of the air nozzle extending in the direction parallel to the cleaning target face, and air existing on the cleaning target face, namely, the air reflected by the cleaning target face, is sucked from the suction port of the suction nozzle arranged adjacent to and in parallel to the air nozzle. Consequently, dust soared by the air jetted from the jet port can be sucked immediately by the suction port arranged adjacent to the jet port. Therefore, such a situation that the dust reattaches to the cleaning target face can be suppressed well.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

In the following, an embodiment of the present invention is described with reference to the accompanying drawings.

Figure 1:
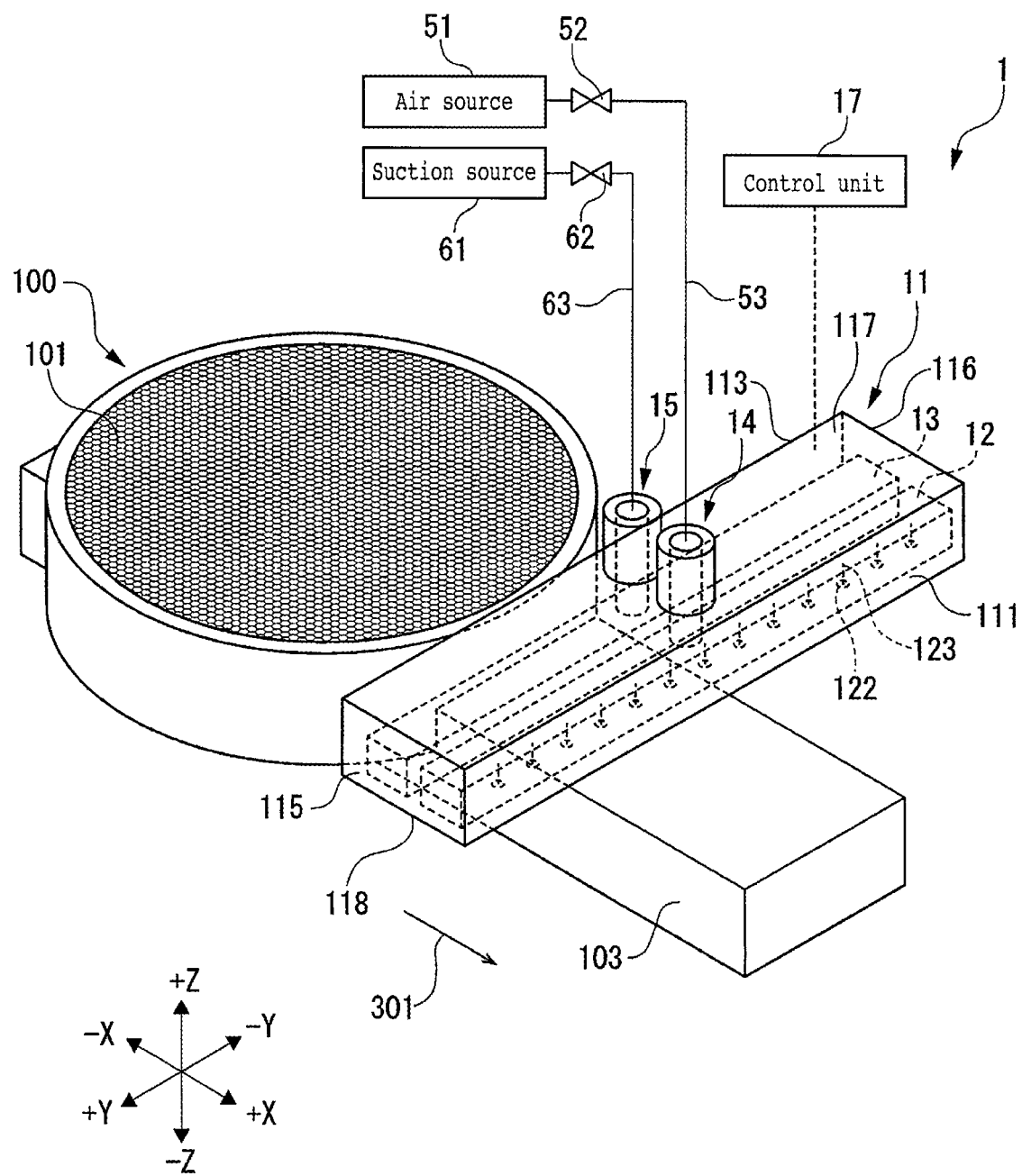
FIG. 1 is a perspective view depicting a configuration of a cleaning nozzle.

A cleaning nozzle 1 according to the present embodiment depicted in FIG. 1 is used to clean a cleaning target face that is one of a holding face for holding the workpiece and/or the surface of the workpiece held on the holding face.

In the present embodiment, a configuration and an operation of the cleaning nozzle 1 are described where a holding face 101 of a chuck table 100 of a tape mounter is the cleaning target face.

The chuck table 100 has the holding face 101 composed of a porous material. The holding face 101 is communicated with a suction source (not depicted) such that it sucks and holds a workpiece such as a semiconductor wafer. Further, the chuck table 100 is supported for movement on a rail 103 that configures a horizontal moving mechanism. The chuck table 100 can move in a direction indicated by an arrow mark 301 (+X direction) along the rail 103 by driving force from a driving source not depicted.

The cleaning nozzle 1 is arranged above the rail 103. The cleaning nozzle 1 is configured to clean the holding face 101 of the chuck table 100 that moves along the rail 103.

As depicted in FIG. 1, the cleaning nozzle 1 includes a housing 11 of a flattened rectangular parallelepiped shape, an air nozzle 12 and a suction nozzle 13 arranged in the housing 11, an air connection portion 14 connected to the air nozzle 12 and protruding upwardly from the housing 11, and a suction connection portion 15 connected to the suction nozzle 13 and protruding upwardly from the housing 11. Further, the cleaning nozzle 1 includes a control unit 17 that controls the members of the cleaning nozzle 1.

The air connection portion 14 is a connection member for communicating the air nozzle 12 with an air source 51 including a compressor and so forth and is connected to the air source 51 through an air pipe 53 and an air valve 52. If the air valve 52 is opened, then the air nozzle 12 is communicated with the air source 51 through the air connection portion 14, the air pipe 53, and the air valve 52.

The suction connection portion 15 is a connection member for communicating the suction nozzle 13 with a suction source 61 including a vacuum pump and so forth and is connected to the suction source 61 through a suction pipe 63 and a suction valve 62. If the suction valve 62 is opened, then the suction nozzle 13 is communicated with the suction source 61 through the suction connection portion 15, the suction pipe 63, and the suction valve 62.

The housing 11 is arranged such that a longitudinal direction thereof is directed in a Y-axis direction orthogonal to an X-axis direction that is a direction of movement of the chuck table 100.

Figure 2:
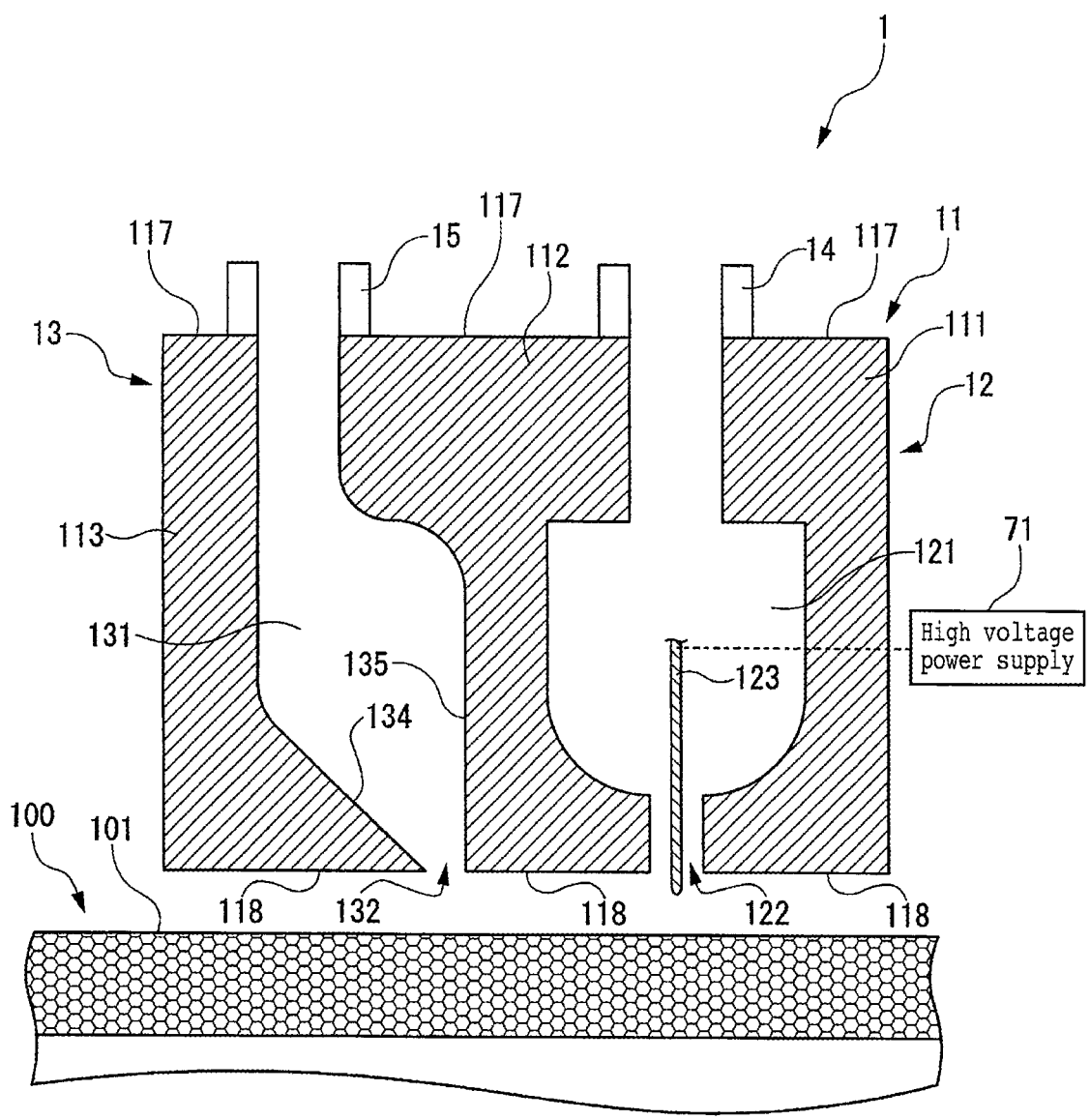
FIG. 2 is a cross sectional view depicting a configuration of the cleaning nozzle.

Further, as depicted in FIGS. 1 and 2, the air nozzle 12 and the suction nozzle 13 are provided such that they extend along the longitudinal direction of the housing 11 (Y-axis direction) and are lined up in the X-axis direction.

In particular, as depicted in FIGS. 1 and 2, the housing 11 has a first side wall 111 that is a side wall on the +X side, a middle wall 112 that is a partition wall in the middle, and a second side wall 113 that is a side wall on the −X side.

The first side wall 111, the middle wall 112, and the second side wall 113 have upper faces that form a top face 117 of the housing 11 (face on the +Z side). Further, the first side wall 111, the middle wall 112, and the second side wall 113 have lower faces that form a bottom face 118 of the housing 11 (face on the −Z side).

Further, as depicted in FIG. 1, the housing 11 has a third side wall 115 on the +Y side and a fourth side wall 116 on the −Y side.

Further, as depicted in FIGS. 1 and 2, the air nozzle 12 includes the first side wall 111, the middle wall 112, the third side wall 115, the fourth side wall 116, and an air space 121 that is an internal space surrounded by these walls.

Meanwhile, the suction nozzle 13 includes the middle wall 112, the second side wall 113, the third side wall 115, the fourth side wall 116, and a suction space 131 that is an internal space surrounded by the walls.

Further, the air space 121 of the air nozzle 12 is covered from above with a portion of the top face 117 of the housing 11, which is formed from the upper face of the first side wall 111 and the upper face of the middle wall 112. The air space 121 and the air connection portion 14 are connected to each other through an opening provided at part of the top face 117.

Below the air space 121, a portion of the bottom face 118 of the housing 11, which is formed from the lower face of the first side wall 111 and the lower face of the middle wall 112, is arranged. An jet port 122 is provided at the portion of the bottom face 118. The jet port 122 is a hole that communicates the air space 121 and the outside with each other and is an jet port for jetting air to the outside of the air nozzle 12.

In the present embodiment, as depicted in FIG. 1, a plurality of jet ports 122 are provided in the bottom face 118 of the housing 11 so as to be lined up at predetermined distances along the Y-axis direction. The portion between adjacent each ones of the jet ports 122 below the air space 121 is closed up.

Further, as depicted in FIGS. 1 and 2, the air nozzle 12 has electrode needles 123 that are needle-shaped electrodes extending from the air space 121 toward the jet ports 122. A high voltage power supply 71 is connected to the electrode needles 123. If a high voltage is applied from the high voltage power supply 71 (refer to FIG. 2) to the electrode needles 123, then it causes corona discharge and can ionize air that passes near the electrode needles 123. Accordingly, the air nozzle 12 can jet the thus ionized air from the jet ports 122.

It is to be noted that the high voltage power supply 71 may be any of a direct current power supply and a high frequency power supply.

On the other hand, the suction space 131 of the suction nozzle 13 is covered from above with a portion of the top face 117 of the housing 11, which is formed from the upper face of the middle wall 112 and the upper face of the second side wall 113. The suction space 131 and the suction connection portion 15 are connected to each other through an opening provided at part of the top face 117.

At a lower portion of the suction space 131, a portion of the bottom face 118 of the housing 11, which is formed from the lower face of the middle wall 112 and the lower face of the second side wall 113, is arranged. At the portion of the bottom face 118, a suction port 132 for sucking external air into the suction space 131 is provided such that it extends along the Y-axis direction.

The suction port 132 has a grooved shape extending along the Y-axis direction, which is formed between a vertical inner wall 135 of the middle wall 112 extending in the Y-axis direction and an inclined inner wall 134 of the second side wall 113 extending in the Y axis direction in a state in which it is inclined toward the +X side (middle wall 112 side). Since the suction port 132 has the inclined inner wall 134, it is configured such that it can suck air existing on the +X side (air nozzle 12 side).

In this manner, the air nozzle 12 has the jet ports 122 that jet air toward the holding face 101 and extend in a direction parallel to the holding face 101 that is the cleaning target face. Further, the suction nozzle 13 is arranged adjacent to and in parallel to the air nozzle 12 and has the suction port 132 for sucking air existing on the holding face 101.

It is to be noted that a height of the cleaning nozzle 1 (height of the air nozzle 12 and the suction nozzle 13) when the cleaning nozzle 1 is placed above the holding face 101 of the chuck table 100 held on the rail 103 is set to such a degree that a small gap is provided between the holding face 101 and the bottom face 118 (jet ports 122 and suction port 132) of the housing 11 of the cleaning nozzle 1.

The control unit 17 executes various processes and controls the overall components of the cleaning nozzle 1 to control a cleaning operation of the holding face 101 by the cleaning nozzle 1.

In the following, a cleaning operation (cleaning method) of the holding face 101 of the chuck table 100 by the cleaning nozzle 1 is described.

Figure 3:
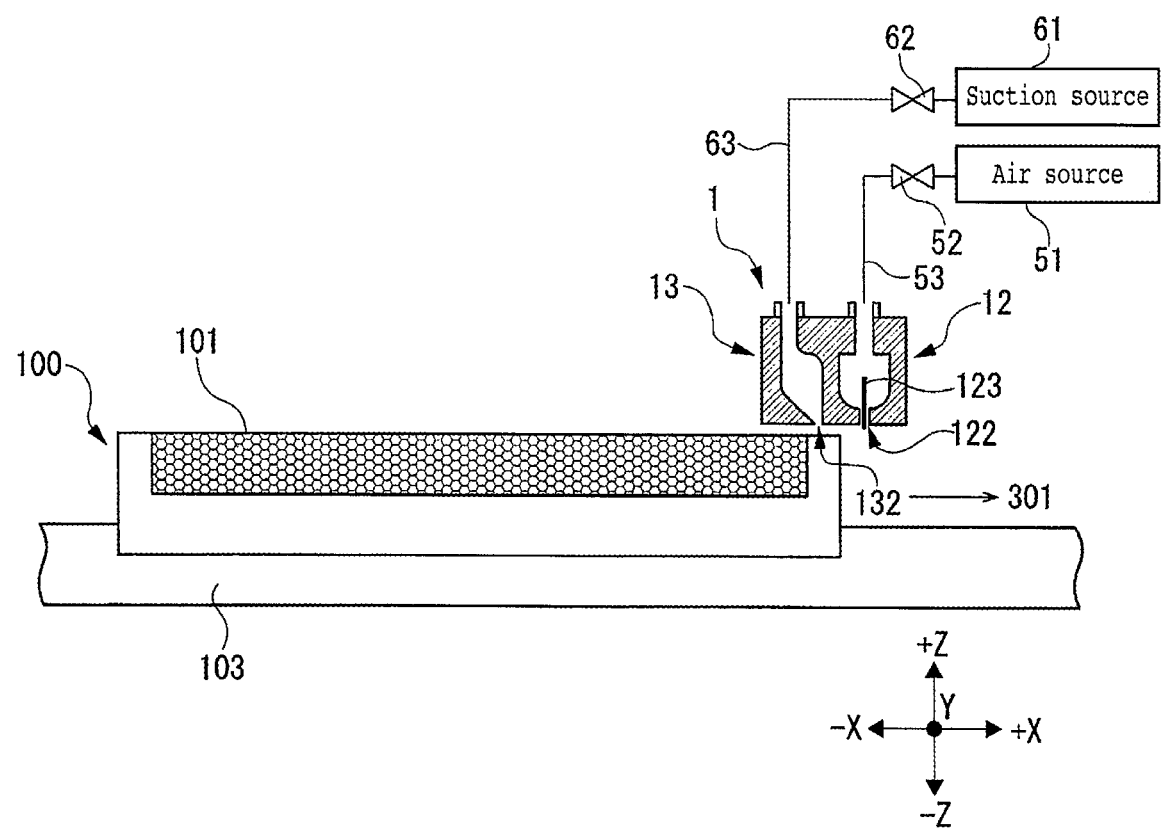
FIG. 3 is a cross sectional view depicting a cleaning operation by the cleaning nozzle.

First, as depicted in FIG. 3, a worker or the control unit 17 places the cleaning nozzle 1 in parallel to the holding face 101 above the holding face 101, which is the cleaning target face, leaving a small gap therebetween (placement step). In particular, in the placement step, the cleaning nozzle 1 is placed above the holding face 101 such that the bottom face 118, on which the jet ports 122 of the air nozzle 12 and the suction port 132 of the suction nozzle 13 of the cleaning nozzle 1 are formed, and the holding face 101 become parallel to each other and besides a small gap is provided between the holding face 101 and the bottom face 118 of the cleaning nozzle 1.

Figure 4:
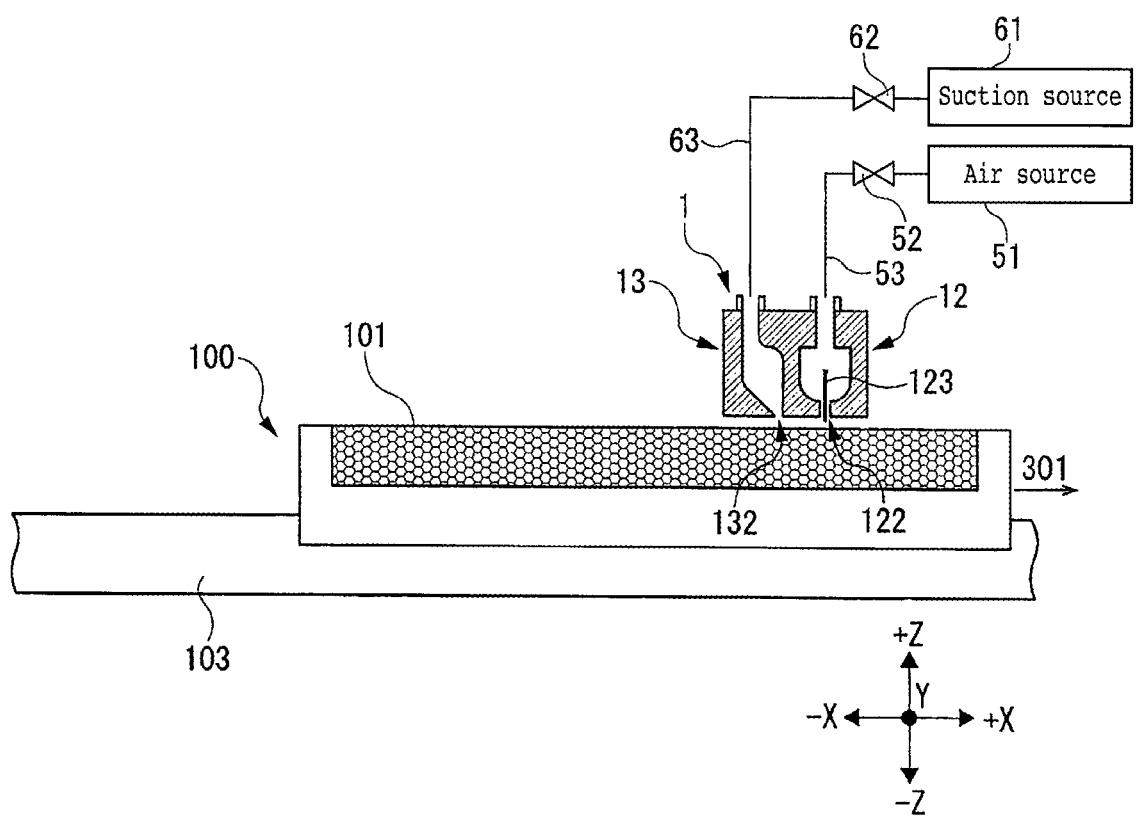
FIG. 4 is another cross sectional view depicting the cleaning operation by the cleaning nozzle.

Then, as depicted in FIGS. 3 and 4, the cleaning nozzle 1 placed in the placement step and the holding face 101 are relatively moved in the X-axis direction. This direction is a direction parallel to the holding face 101 and besides is a direction crossing with the extension direction of the cleaning nozzle 1.

In the present embodiment, the chuck table 100 is moved in a direction indicated by the arrow mark 301 (+X direction) along the rail 103 by driving force from a driving source not depicted. This movement of the chuck table 100 may be carried out by a control section not depicted of the table mounter or may be carried out under the control of the control unit 17 of the cleaning nozzle 1.

It is to be noted that, as depicted in FIGS. 3 and 4, when the holding face 101 moves with respect to the cleaning nozzle 1, the suction port 132 of the suction nozzle 13 is arranged on an upstream side (−X direction side) with respect to the jet ports 122 of the air nozzle 12 in the moving direction (+X direction) of the holding face 101.

Consequently, above portions (portions to be cleaned) of the holding face 101 that moves with respect to the cleaning nozzle 1, the suction port 132 of the suction nozzle 13 is arranged earlier than the jet ports 122 of the air nozzle 12.

In the state in which the holding face 101 is moved in the direction indicated by the arrow mark 301 (+X direction) with respect to the cleaning nozzle 1 in this manner, the control unit 17 jets air from the jet ports 122. In particular, the control unit 17 opens the air valve 52. Consequently, the air nozzle 12 (air space 121) is communicated with the air source 51 through the air connection portion 14, the air pipe 53, and the air valve 52. Further, the control unit 17 controls the high voltage power supply 71 (refer to FIG. 2) to apply a voltage to the electrode needles 123 of the air nozzle 12.

Figure 5:
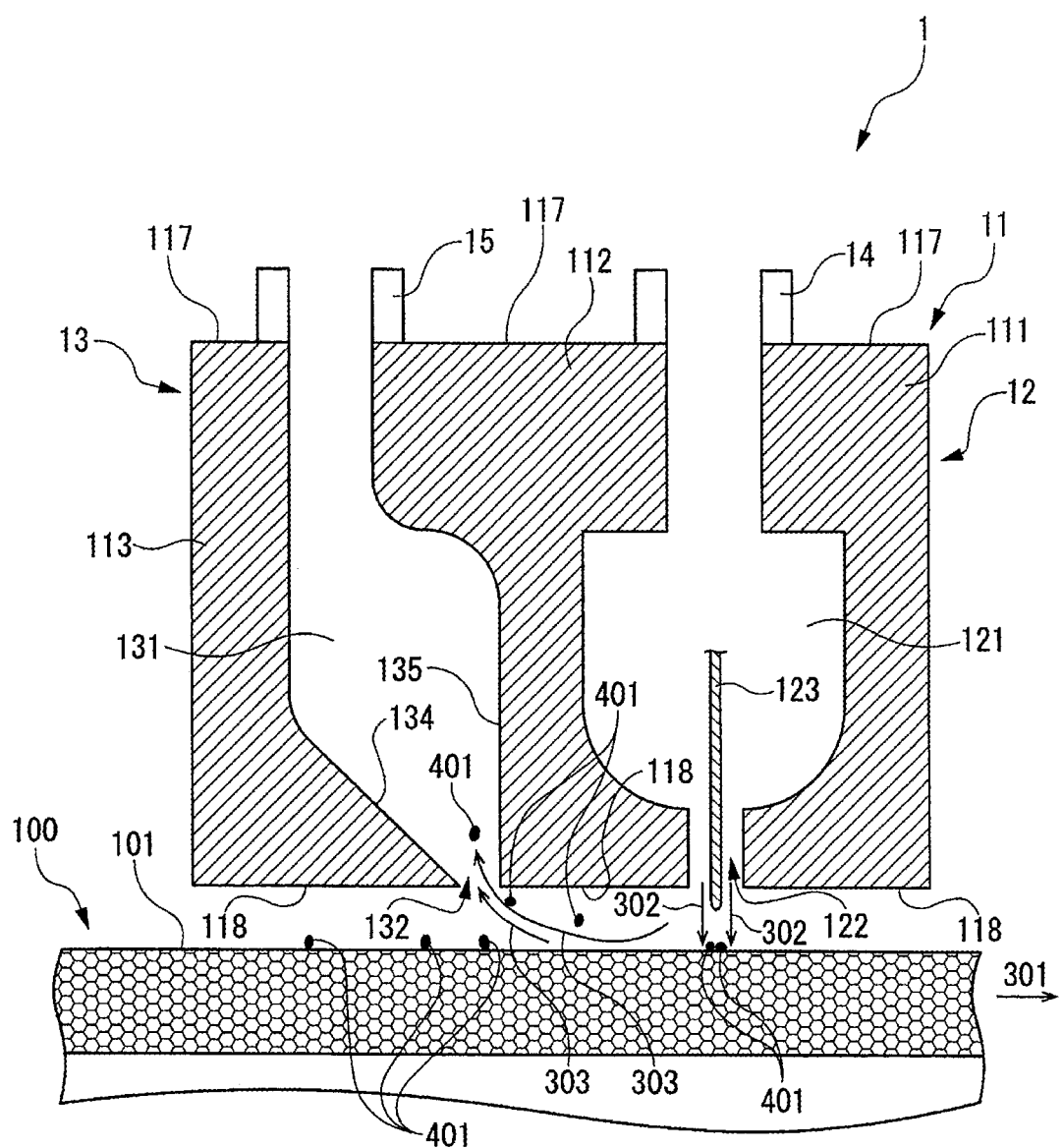
FIG. 5 is still another cross sectional view depicting the cleaning operation by the cleaning nozzle.

As a result, as indicated by an arrow mark 302 of FIG. 5, ionized air is jetted from the jet ports 122 of the air nozzle 12. This ionized air is reflected by the holding face 101 that is the cleaning target face to blow off (blow up) dust 401 on the holding face 101.

Further, the control unit 17 sucks the air reflected by the holding face 101 through the suction port 132.

In particular, the control unit 17 opens the suction valve 62. Consequently, the suction nozzle 13 (suction space 131) is communicated with the suction source 61 through the suction connection portion 15, the suction pipe 63, and the suction valve 62. Consequently, the soared dust 401 is sucked into the suction port 132 of the suction nozzle 13 together with the air reflected by the holding face 101 as indicated by an arrow mark 303 of FIG. 5. The holding face 101 is cleaned thereby (cleaning step).

As above, in the present embodiment, air is jetted from the jet ports 122 of the air nozzle 12 extending in a direction parallel to the holding face 101 and air existing on the holding face 101, namely, air reflected by the holding face 101, is sucked from the suction port 132 of the suction nozzle 13 arranged adjacent to the air nozzle 12 and in parallel to the air nozzle 12. Consequently, the dust 401 soared by the air jetted from the jet ports 122 can be sucked immediately by the suction port 132 arranged adjacent to the jet ports 122. Therefore, such a situation that the dust 401 reattaches to the holding face 101 can be suppressed well.

Further, since the suction port 132 has the inclined inner wall 134 (refer to FIG. 2), air existing on the +X side (air nozzle 12 side) can be sucked easily.

Further, in the present embodiment, the air nozzle 12 is configured such that it jets ionized air from the suction port 132 thereof. In this connection, the dust 401 (FIG. 5) on the holding face 101 are in most cases attached to the holding face 101 by an action of static electricity. Accordingly, in the present embodiment, by jetting ionized air to the holding face 101, the dust 401 attached to the holding face 101 can be removed well from the holding face 101.

Further, by using ionized air as the air to be jetted from the jet ports 122, even if the wind pressure of the air to be jetted from the jet ports 122 is low, the dust 401 can be removed. Accordingly, the consumption amount of air for cleaning can be suppressed.

It is to be noted that, in the description of the present embodiment, a configuration and an operation of the cleaning nozzle 1 are described taking the holding face 101 of the chuck table 100 as a cleaning target face. Regarding this, the cleaning target face may otherwise be the surface of a workpiece held on the holding face 101. In other words, it is also possible for the cleaning nozzle 1 of the present embodiment to clean the surface of a workpiece held on the holding face 101.

Further, the cleaning nozzle 1 indicated in the present embodiment not only can be used for cleaning of the holding face 101 of the chuck table 100 of the tape mounter but also can be used widely for cleaning of a holding face to be cleaned by dry cleaning such as a holding face of a holding table of a peeling apparatus for peeling a tape from a workpiece, a holding face of a robot hand for holding and transporting a workpiece, a holding face of a holding table of a dry processing apparatus that processes a workpiece by dry processing (for example, a laser processing apparatus) and so forth.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cleaning method for cleaning a cleaning target face that is one of a holding face for holding a workpiece and/or a surface of the workpiece held on the holding face, by using a cleaning nozzle,
    the cleaning nozzle including:
        an air nozzle having a jet port for jetting air toward the cleaning target face and extending in a direction parallel to the cleaning target face, an air space above the jet port, and an electrode needle that extends from the air space toward the jet port, and
        a suction nozzle having a suction port for sucking air existing on the cleaning target face and arranged adjacent to and in parallel to the air nozzle,
    the cleaning method comprising:
    a placement step of placing the cleaning nozzle above the cleaning target face in parallel to the cleaning target face with a gap left therebetween;
    a cleaning step, while relatively moving the cleaning target face in a direction parallel to the cleaning target face and besides crossing with an extension direction of the cleaning nozzle placed by the placement step, air from the jet port and sucking the air reflected by the cleaning target face through the suction port to clean the cleaning target face, wherein the cleaning nozzle remains stationary during the cleaning step; and applying a voltage to the electrode needle, such that the air nozzle jets ionized air from the jet port.

2. The cleaning method according to claim 1, wherein, in the cleaning step, the suction port of the suction nozzle is arranged on an upstream side with respect to the jet port of the air nozzle in a direction of the movement of the cleaning target face with respect to the cleaning nozzle.

3. The cleaning method according to claim 1, wherein a width of the cleaning nozzle is greater than a diameter of the cleaning target face.

4. The cleaning method according to claim 1, wherein the electrode needle extends past the jet ports and into the gap.

5. The cleaning method according to claim 1, wherein a top portion of the air space is formed by a top face of a housing of the cleaning nozzle, wherein the air space has a diameter greater than a diameter of an air connection portion of the air nozzle.

6. The cleaning method according to claim 1, wherein the suction nozzle includes a suction space above the suction port, wherein the suction port has an inclined inner wall and an opposite vertical inner wall, wherein the inclined inner wall and the opposite vertical inner wall are separated from each other by a distance that gradually increases from the gap upwards into the suction space.

7. The cleaning method according to claim 1, wherein the air nozzle includes a plurality of the jet ports, wherein each of the plurality of jet ports is a hole and a portion between adjacent jet ports of the plurality of jet ports below the air space is closed up.

8. A cleaning method for cleaning a cleaning target face that is one of a holding face for holding a workpiece and/or a surface of the workpiece held on the holding face, by using a cleaning nozzle, the cleaning nozzle including:
an air nozzle having a jet port for jetting air toward the cleaning target face and extending in a direction parallel to the cleaning target face, and
a suction nozzle having a suction port for sucking air existing on the cleaning target face and arranged adjacent to and in parallel to the air nozzle, the cleaning method comprising:
a placement step of placing the cleaning nozzle above the cleaning target face in parallel to the cleaning target face with a gap left therebetween; and
a cleaning step of jetting, while linearly moving the cleaning target face relative to the cleaning nozzle placed by the placement step in a direction, which is both parallel to the cleaning target face and perpendicular with an extension direction of the cleaning nozzle, air from the jet port and sucking the air reflected by the cleaning target face through the suction port to clean the cleaning target face, wherein the suction port of the suction nozzle is arranged on an upstream side with respect to the jet port of the air nozzle in the direction of the movement of the cleaning target face with respect to the cleaning nozzle and wherein the jet port is a hole which is perpendicular to the cleaning target face wherein the cleaning nozzle remains stationary during the cleaning step.

9. The cleaning method according to claim 8, wherein the air nozzle includes an air space above the jet port, and an electrode needle that extends from the air space toward the jet port,
wherein the cleaning step further comprises:
applying a voltage to the electrode needle, such that the air nozzle jets ionized air from the jet port.

10. The cleaning method according to claim 9, wherein the electrode needle extends past the jet port and into the gap.

11. The cleaning method according to claim 8, wherein a width of the cleaning nozzle is greater than a diameter of the cleaning target face.

12. The cleaning method according to claim 8, wherein the suction nozzle includes a suction space above the suction port, wherein the suction port has an inclined inner wall and an opposite vertical inner wall, wherein the inclined inner wall and the opposite vertical wall are separated from each other by a distance that gradually increases from the gap upwards into the suction space.

13. The cleaning method according to claim 8, wherein the air nozzle includes a plurality of the jet ports, wherein a portion between adjacent jet ports of the plurality of jet ports below the air space is closed up.

\* \* \* \* \*